(12) United States Patent
Dong

(10) Patent No.: US 6,849,519 B2
(45) Date of Patent: Feb. 1, 2005

(54) METHOD OF FORMING AN ISOLATION LAYER IN A SEMICONDUCTOR DEVICES

(75) Inventor: Cha Deok Dong, Kyungki-Do (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 10/611,500

(22) Filed: Jul. 1, 2003

(65) Prior Publication Data

US 2004/0005767 A1 Jan. 8, 2004

(30) Foreign Application Priority Data

Jul. 4, 2002 (KR) .................................. 10-2002-0038723

(51) Int. Cl.[7] .............................................. H01L 21/76
(52) U.S. Cl. ....................... 438/424; 438/433; 438/435; 257/506; 257/519
(58) Field of Search ................................ 257/506, 519, 257/524; 438/424–435, 407, 259, 201

(56) References Cited

U.S. PATENT DOCUMENTS 4,866,004 A * 9/1989 Fukushima ................. 438/432
6,165,871 A * 12/2000 Lim et al. ................... 438/437
6,355,540 B2 * 3/2002 Wu ............................. 438/433

* cited by examiner

*Primary Examiner*—Matthew Smith
*Assistant Examiner*—Calvin Lee
(74) *Attorney, Agent, or Firm*—Marshall, Gerstein & Borun LLP

(57) ABSTRACT

A method of forming an isolation layer in semiconductor devices is disclosed. The method includes forming the isolating film by means of a method in which a method of forming a V-type trench at the isolation region, implanting ions capable of accelerating oxidization action into the center portion of the V-type trench, implementing an oxidization process to form an insulating film consisting of an oxide film at the isolation region, and then completely burying the trench with an insulating material, using the LOCOS method, and a method of forming a trench type isolation layer, are applied together. Therefore, as the top corner of the trench is formed with an inclination, and a concentration of the electric field and a formation of a moat can be simultaneously prevented.

7 Claims, 4 Drawing Sheets

METHOD OF FORMING AN ISOLATION LAYER IN A SEMICONDUCTOR DEVICES

BACKGROUND

Technical Field

A method for forming an isolation layer in the semiconductor device is disclosed, which is capable of simultaneously preventing a concentration of an electric field on a top corner of a trench and formation of an undesirable moat.

BACKGROUND OF THE RELATED ART

In all the processes of manufacturing semiconductor devices, an isolation layer is formed in an isolation region in order to electrically isolate respective devices formed at the semiconductor substrate. In the prior art, the isolation layer is formed by LOCOS (local oxidation) process. As the degree of integration of the semiconductor device increases, however, the isolation layer has recently been formed by means of a process of etching the semiconductor substrate by a given depth to form the trench and the trench is buried with an insulating material. The isolation layer formed thus is called a trench-type isolation layer.

The trench-type isolation layer is formed by forming a pad oxide film and a pad nitride film through which the isolation region is exposed on a semiconductor substrate, etching the semiconductor substrate in the isolation region and then burying an insulating material layer. Thus, even though the pad nitride film and the pad oxide film are removed, the insulating material layer buried between the pad nitride film and the pad oxide film remains intact. Due to this, the isolation layer consisting of the insulating material layer has a shape in which the isolation layer is buried into the trench and a shape in which the width of the isolation layer is narrower than that of the isolation region and the upper side thereof is projected higher than the surface of the semiconductor substrate.

In the manufacturing of flash memory cells, the isolation layer is also formed using the trench type isolation layer. Currently, the isolation layer is formed by means of SAFG (self aligned floating gate) process by which a polysilicon layer for a floating gate is isolated by a projection of the trench-type isolation layer. If the polysilicon layer for the floating gate is isolated by the projection of the trench-type isolation layer, a region where the floating gate will be formed can be reduced since the distance between the floating gates can be more narrowed. Therefore, the coupling ratio of the floating gate can be increased.

In the above process, one of the most important things to prevent is the tunnel oxide film or the gate oxide film from being too thin, while simultaneously preventing a concentration of the electric field at a ton corner of the trench and the formation of a moat. There is a problem in that the top corner of the trench may not be formed locally within the wafer because the process conditions of the etch process for forming the isolation layer can vary.

SUMMARY OF THE DISCLOSURE

Accordingly, a method for forming an isolation layer in a semiconductor device, is disclosed which is capable of simultaneously preventing a concentration of the electric field and formation of a moat. The disclosed method forms the isolating film by forming a V-type trench at the isolation region, implanting ions capable of accelerating oxidation action into the center portion of the V-type trench, implementing an oxidization process to form an insulating film consisting of an oxide film at the isolation region, and then completely burying the trench with an insulating material, using the LOCOS method, and forming a trench-type isolation layer, whereby a top corner of the trench is formed with an inclination.

In an embodiment, the method comprises sequentially forming a tunnel oxide film and a pad nitride film on a semiconductor substrate and then forming an aperture through which an isolation region of the semiconductor substrate is exposed, forming a V-type trench at the isolation region, forming an insulating film spacer at the sidewall of the pad nitride film in the aperture, forming an ion implantation layer for accelerating oxidization at the bottom of the V-type trench that is exposed through the aperture, forming a first insulating film at the V-type trench by means of an oxidization process, burying the aperture on the first insulating film with a second insulating film, and removing the pad nitride film and the pad oxide film.

In the above, a tilt angle of the V-type trench is in the range of 25~45°.

The ion implantation layer is formed by implanting arsenic (As). At this time, arsenic (As) is implanted with energy of 15~50 keV and the dose of implantation of As is 1E14~1E16 cm$^{-2}$.

The oxidization process is performed at a temperature of 800~950° C. by setting an oxidization target thickness of 300~1000 Å, whereby the first insulating film is formed in with a thickness in the range of 1500~4000 Å by means of the ion implantation layer for accelerating oxidization.

The second insulating film is formed using a HDP oxide film and is formed with thickness in the range of 2000~5000 Å.

Additional advantages, and features of the disclosed methods will be set forth in part in the following detailed description other features and advantages will become apparent to those of ordinary skill in the art upon examination of this disclosure.

It will be understood that both the foregoing general description and the following detailed description are exemplary and explanatory and are intended to provide further explanation of the methods claimed.

BRIEF DESCRIPTION OF THE DRAWINGS

The above and other features and advantages of the disclosed methods will be apparent from the following detailed description in conjunction with the accompanying drawings, wherein.

DETAILED DESCRIPTION OF THE PRESENTLY PREFERRED EMBODIMENTS

Figure 1A:
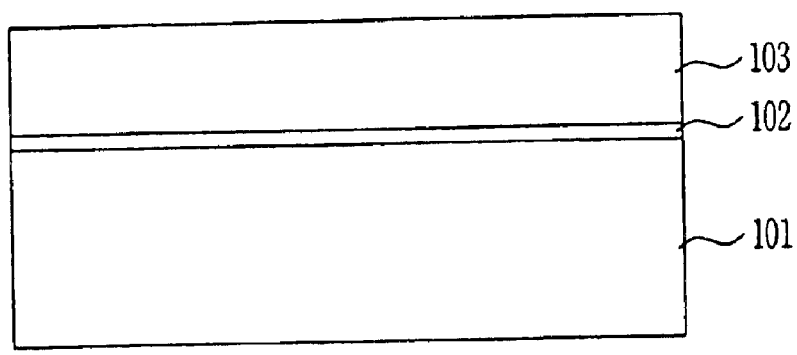
FIG. 1A through FIG. 1L are cross-sectional views of semiconductor devices for explaining a disclosed method of forming an isolation layer in the devices.

Reference will now be made in detail to the preferred embodiments, examples of which are illustrated in the accompanying drawings, in which like reference numerals are used to identify the same or similar parts.

A method of forming an isolation layer in the semiconductor devices will be now described in detail by reference to FIG. 1A through FIG. 1L.

Referring now to FIG. 1A, a pad oxide film 102 and a pad nitride film 103 are sequentially formed on a semiconductor substrate 101, in order to prohibit generation of crystal defects on the entire structure and implement surface processing.

The pad oxide film 102 is formed in thickness of 50~70 Å by means of dry oxidization mode or wet oxidization mode at a temperature of 750~900° C. Further, the pad nitride film 103 may be formed in thickness of 700~2000 Å by means of LP-CVD method. At this time, the thickness of the pad nitride film 103 is not limited to the above value. Instead, the thickness of the pad nitride film 103 may be determined depending on the process condition so that the top of the isolation layer is protruded higher by maximum than the surface of the semiconductor substrate 101 when the chemical mechanical polishing process is implemented as the last process to form the isolation layer and the pad nitride film is the removed.

Meanwhile, cleaning process may be performed before the pad oxide film 102 is formed. At this time, the cleaning process may be implemented sequentially using hydrofluoric acid (DHF) where $H_2O:HF$ is mixed at the ratio of 50:1~100:1, and a SC-1 ($NH_4OH/H_2O_2/H_2O$) solution, or sequentially using a BOE (buffered oxide etchant) in which a mixed solution where $NH_4F:HF$ is mixed at the ratio of 4:1~7:1 is diluted into $H_2O$ at the ratio of 1:100~1:300, and a SC-1 ($NH_4OH/H_2O_2/H_2O$) solution.

Figure 1B:
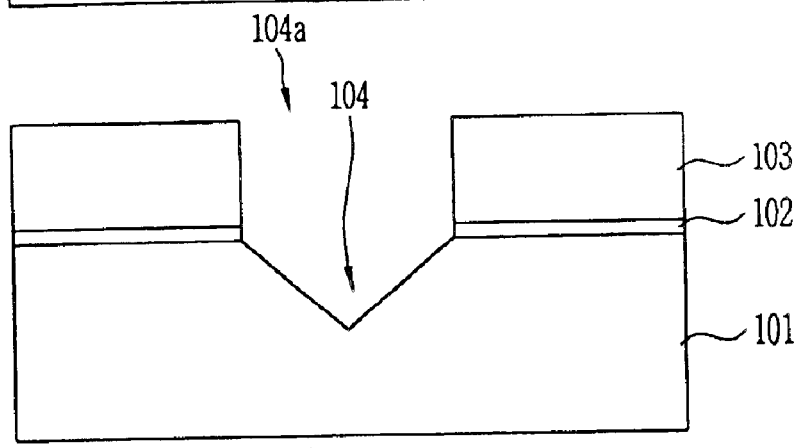

Referring now to FIG. 1B, the pad nitride film 103 and the pad oxide film 102 are sequentially etched by means of etch process using the isolation mask (not shown), thus forming an aperture 104a through which the isolation region of the semiconductor substrate 101 is exposed. Thereby, the pad oxide film 102 and the pad nitride film 103 through which the isolation region of the semiconductor substrate 101 is exposed are formed to be a stack structure.

Next, the semiconductor substrate 101 of the isolation region, which is exposed through the aperture 104a, is etched to form a V-type trench 104. At this time, the etched portion of the pad nitride film 103 is formed to be vertical and the sidewalls of the V type trench 104 are formed to have a tilt angle of 25~45°.

Figure 1C:
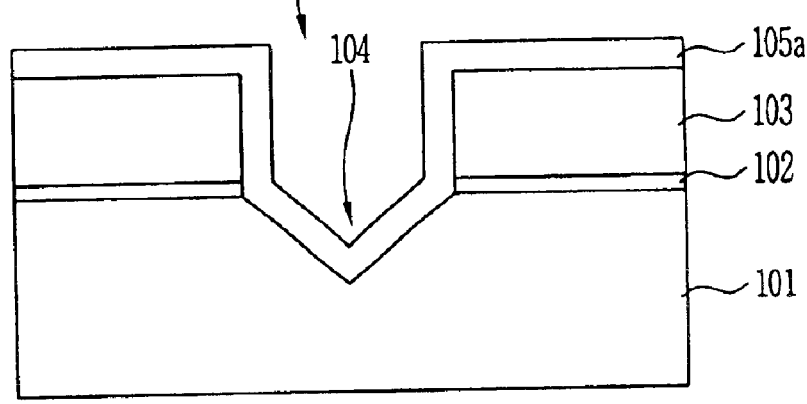

By reference to FIG. 1C, in order to form an insulating film spacer at the sides of the aperture 104a in the pad nitride film 103, an insulating material layer 105a is formed on the entire structure. At this time, the insulating material layer 105a is formed to have an adequate thickness considering the thickness of the insulating film spacer to be formed at the pad nitride film 103. Preferably, the insulating material layer 105a is formed in thickness of 300~1000Å. Meanwhile, the insulating material layer 105a may be formed using nitride like the pad nitride film 103.

Figure 1D:
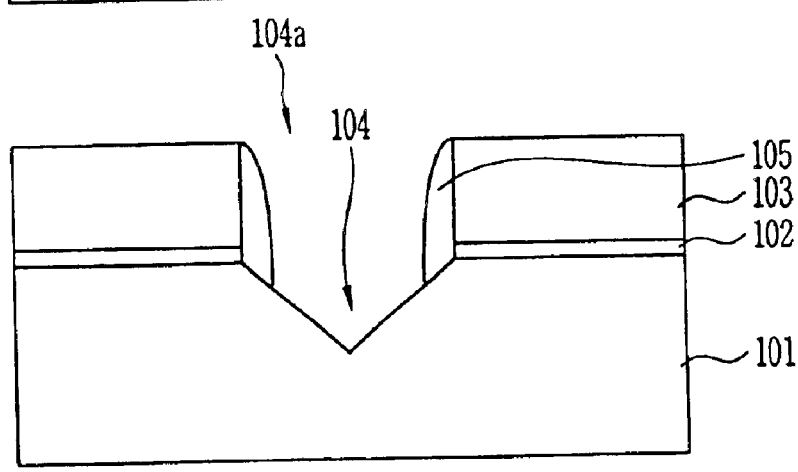

Referring to FIG. 1D, the insulating material layer (105a in FIG. 1C) remains only at the sidewalls of the aperture 104a in the pad nitride film 103, by means of blanket etch process, thus forming the insulating film spacer 105 at the sidewall of the pad nitride film 103. While the width of the aperture 104a is narrowed by the insulating film spacer 105, only a deep portion at the center of the V-type trench 104 is exposed.

Figure 1E:
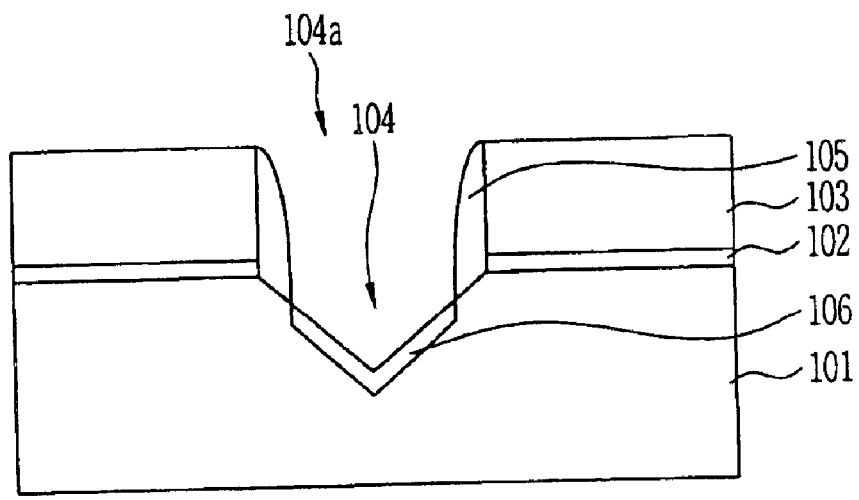

By reference to FIG. 1E, in order to accelerate oxidization in a subsequent oxidization process, ions for accelerating oxidization are implanted into the deep portion of the center of the V type trench 104 exposed through the aperture 104a. Thereby, an ion implantation layer 106 is formed at the deep portion of the center of the V-type trench 104.

In the above, the ion implanted into the deep portion of the center of the V-type trench 104 may include arsenic (As). The dose of implantation is 1E14~1E16 $cm^{-2}$. Meanwhile, when the ion is implanted by ion implantation process, the ion is implanted using the energy of 15~50 keV.

Figure 1F:
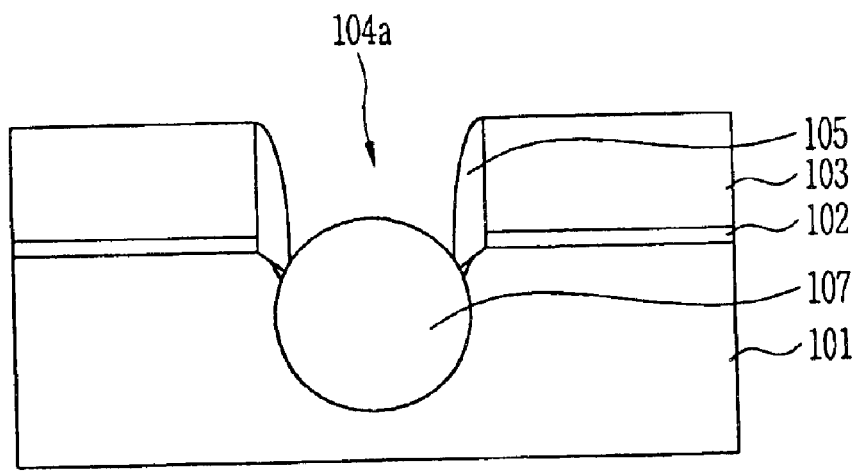

Referring to FIG. 1F, in order to remove a native oxide film (not shown) formed on the surface of the V-type trench 104, the cleaning process is performed and a first insulating film 107 is then formed at the center of the V-type trench (104 in FIG. 1E) exposed through the aperture 104a. At this time, the first insulating film 107 may be formed using an oxide film and the oxide film is formed by the oxidization process of a wet or dry oxidization mode.

In the above, the oxidization process is performed at a temperature of 800~950° C. by setting up an oxidization target thickness to be 300~1000 Å. At this time, as the ion implantation layer (106 in FIG. 1E) for accelerating oxidization is formed at the center of the V type trench (104 in FIG. 1E) exposed through the aperture 104a, the oxidization process rapidly proceeds to form a first insulating film 107 of 1500~4000 Å in thickness.

Figure 1G:
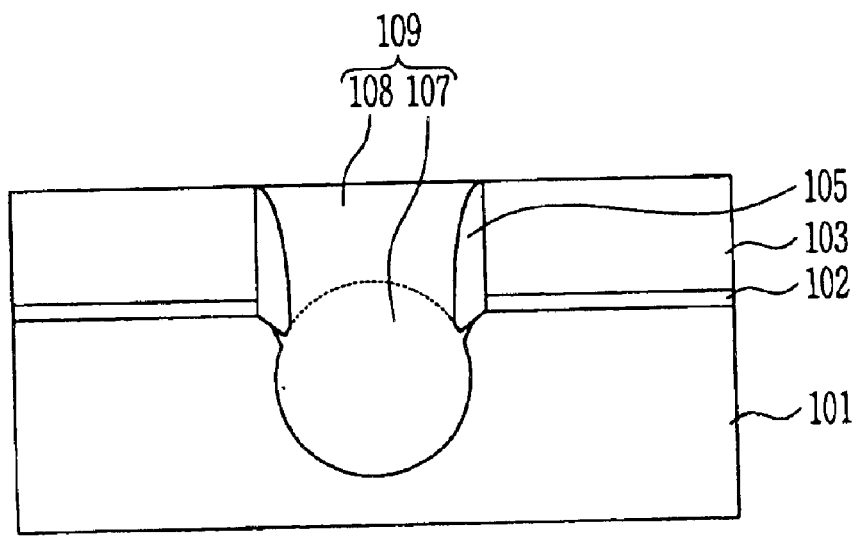
Figure 1H:
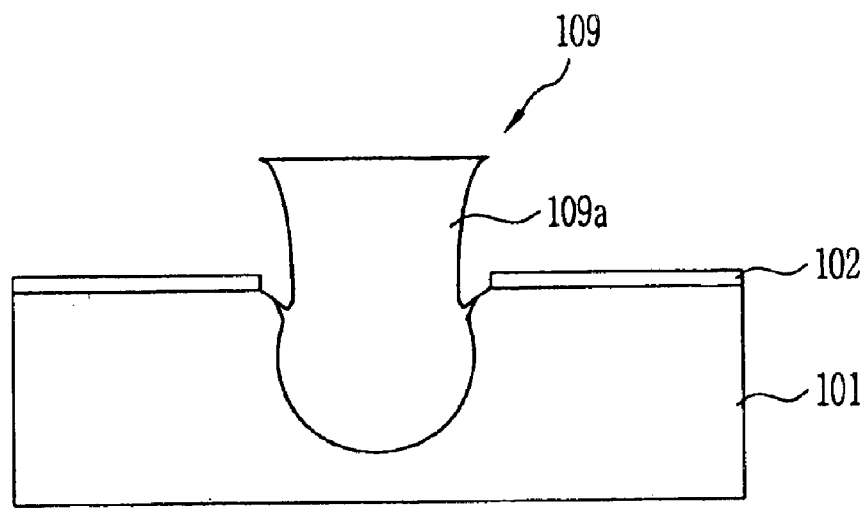

By reference to FIG. 1G, after a second insulating film 108 is formed in the trench, and, as shown in FIG. 1H, the second insulating film 108, insulating material 105 and the pad nitride film 103 are removed. At this time, the second insulating film 108 on the pad nitride film 103 may be removed by means of chemical mechanical polishing using the pad nitride film 103 as a polishing stop layer.

Meanwhile, after the pad nitride film 103 is completely removed in a subsequent process, the height of the isolation layer 109 that protrudes upwardly from the surface of the semiconductor substrate 101 may be determined depending on the original thickness of the pad nitride film 103 remaining after the chemical mechanical polishing. Therefore, if the top of the pad nitride film 103 is excessively removed as the second insulating film on the pad nitride film 103 is removed to expose the pad nitride film 103 during the chemical mechanical polishing process, the extent of the projection of the isolation layer 109 that protrudes higher than the surface of the semiconductor substrate is reduced. This affects the height of the polysilicon layer for the floating gate to be formed in a subsequent process. Accordingly, it is preferred that the process conditions of the chemical mechanical polishing process be controlled so that the projected top of the isolation layer 109 is not lowered.

Thereby, the isolation layer 109 which consists of the second insulating film 108 remaining only at the aperture 104a on the first insulating film 107 and is formed.

In the above, the second insulating film 108 is formed using a HDP (high density plasma) oxide film. Further, the second insulating film 108 is formed in thickness of 2000~5000 Å so that the aperture 104 as well as the trench (104 in FIG. 1E) is completely buried when the second insulating film 108 is formed on the entire structure.

Referring to FIG. 1H, the pad nitride film (103 in FIG. 1G) is removed. At this time, the pad nitride film is removed using phosphoric acid ($H_3PO_4$). Thereby, the projection 109a of the isolation layer 109 is exposed and the surface of the pad oxide film 102 is exposed in the device formation region.

Through the above processes, the isolation layer 109 is formed. Thereafter, if a flash memory cell is to be manufactured, the pad nitride film 103 and the pad oxide film 102 are removed, and the tunnel oxide film, the floating gate the dielectric film and the control gate are then formed on the semiconductor substrate. This manufacture process will be below described in short.

Figure 1I:
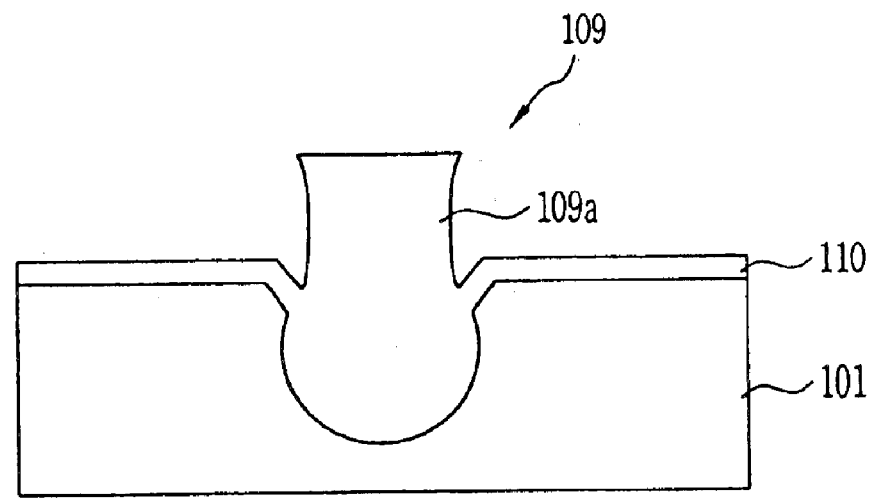

By reference to FIG. 1I, the pad oxide film (102 in FIG. 1H) remaining on the semiconductor substrate 101 is removed. A screen oxide film 110 having a thickness of 50~150 Å is then formed on the semiconductor substrate 101 of the active region where devices will be formed, by means of wet or dry oxidization process at a temperature of 750~900° C. After the screen oxide film 110 is formed, a well (not shown) is formed in the semiconductor substrate 101 of the active region through the ion implantation process. Also, a threshold voltage control layer (not shown) for controlling the threshold voltage of the device such as the transistor or the flash memory cell is formed at a given depth of the semiconductor substrate 101.

In the above, the pad oxide film (102 in FIG. 1H) is removed sequentially using hydrofluoric acid (DHF) where $H_2O$:HF is mixed at the ratio of 50:1~100:1, and a SC-1 ($NH_4OH/H_2O_2/H_2O$) solution.

At this time, in the process of removing the pad oxide film (102 in FIG. 1H), the projection 109a of the isolation layer 109 is also etched by a given thickness. The top of the projection 109a of the isolation layer 109 is wider than the bottom thereof. In the process of removing the pad oxide film (102 in FIG. 1H), however, the top of the projection 109a is more etched than the bottom thereof, so that the difference in widths of the top and bottom of the projection 109a is reduced.

Figure 1J:
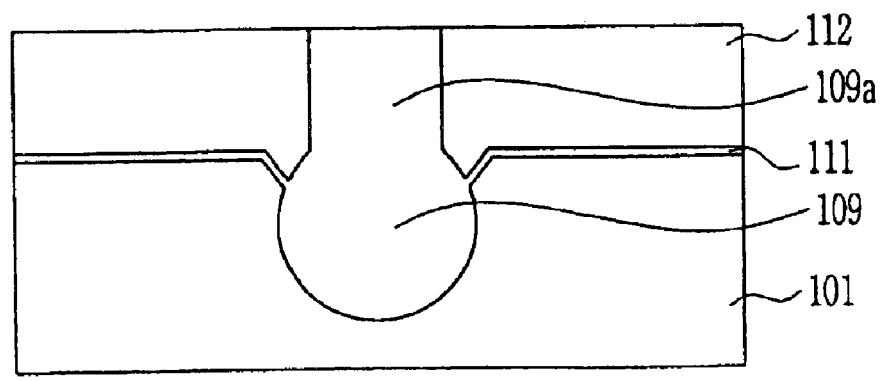

Referring to FIG. 1J, the screen oxide film (110 in FIG. 1I) is removed. A tunnel oxide film 111 and a first polysilicon layer 112 for a floating gate are then sequentially formed on the entire structure. Thereafter, the chemical mechanical polishing process is performed until the surface of the projection 109a of the isolation layer 109 is exposed, thus isolating the first polysilicon layer 112. Thereby, the first polysilicon layer 112 is isolated by the isolation layer 109.

In the above, the screen oxide film (110 in FIG. 1I) is removed sequentially using hydrofluoric acid (DHF) where $H_2O$:HF is mixed at the ratio of 50:1~100:1, and a SC-1 ($NH_4OH/H_2O_2/H_2O$) solution.

Meanwhile, the tunnel oxide film 111 is formed by the wet oxidization process at a temperature of 750~800° C. Next, the tunnel oxide film 111 is annealed under nitrogen atmosphere at a temperature of 900~910° C. for 20~30 minutes, thus minimizing the interfacial defect intensity of the semiconductor substrate 101 and the tunnel oxide film 111. Further, the first polysilicon layer 112 for forming the floating gate is formed using a highly doped polysilicon layer. Specifically, the first polysilicon layer 112 is formed by means of a LP-CVD (low pressure chemical vapor deposition) method using one of $SiH_4$ or $Si_2H_6$ and $PH_3$ gas as a source with an impurity of 1.5E20~3.0E20 atoms/cc. Further, the first polysilicon layer 112 is formed at a temperature of 580~620° C. under a low pressure condition of 0.1~3 Torr in order to minimize the grain size so that the electric field is not concentrated at one place. The first polysilicon layer 112 is formed in thickness of 800~2000 Å.

Further, the chemical mechanical polishing process is implemented so that the first polysilicon layer 112 can be completely isolated by the projection 109a using the projection 109a of the isolation layer 109 as an etch stop layer. Preferably, the chemical mechanical polishing process is performed so that the first polysilicon layer 112 remains at a thickness in the range of 800~1400 Å.

Figure 1K:
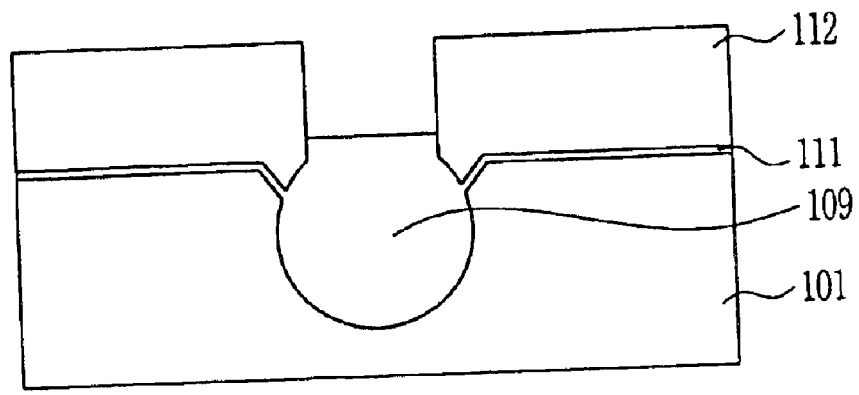

Referring to FIG. 1K, the projection (109a in FIG. 1J) of the isolation layer 109) that is exposed between the first polysilicon layers 112 is removed using HF or BOE (buffered oxide etchant). Thereby, the lateral sides of the first polysilicon layer 112 for the floating gate, which contacts the projection 109a in FIG. 13) of the isolation layer 109, are exposed, so that the coupling ratio of the floating gate can be increased.

Figure 1L:
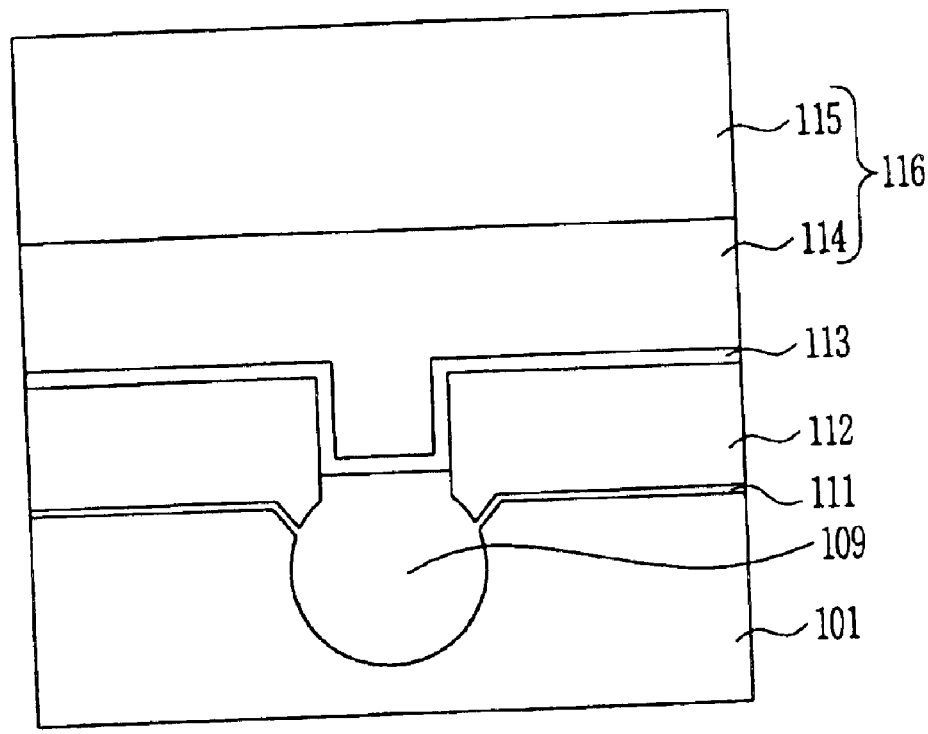

By reference to FIG. 1L, a dielectric film 113, a third silicon layer 114 for a control gate and a silicide layer 115 are sequentially formed on the entire structure.

In the above, the dielectric film 113 may have an ONO structure on which a lower oxide film ($SiO_2$), a silicon nitride film ($Si_3N_4$) and an upper oxide film ($SiO_2$) are sequentially stacked. Also, the suicide layer 115 may be formed using a tungsten silicide (WSix) layer.

At this time, lower and upper oxide films of the ONO dielectric film 113 may be formed using a HTO (hot temperature oxide) film, which is formed using DCS ($SiH_2Cl_2$) and $N_2O$ gas having a good internal pressure and a good TDDB (time dependent dielectric breakdown) characteristic gas as a source gas. Further, the silicon nitride film is formed by means of the LP-CVD method using DOS ($SiH_2Cl_2$) and $NH_3$ gas at a temperature of 650~800° and at a low pressure of 1~3 Torr. After the dielectric film 113 of the ONO structure is formed, a steam anneal process may be performed in a wet oxidization mode at a temperature of 750~800° C. in order to improve the interfacial characteristic between the films. The steam anneal process is performed so that an oxidization target thickness is in the range of 150~300 Å on bare Silicon wafer (monitoring wafer) base.

Meanwhile, the lower oxide film, the silicon nitride film and the upper oxide film are deposited in thickness corresponding to their device characteristics, wherein respective processes of depositing the oxides proceed with no time delay in order to prevent contamination of them with the native oxide film or impurities. At this time, it is preferred that the lower oxide film is formed in thickness of 35~60 Å, the silicon nitride film is formed in thickness of 50~65 Å and the upper oxide film is formed in thickness of 35~60 Å.

Thereafter, though not shown in the drawings, an anti-reflecting film (not shown) consisting of $SiO_xN_y$ or $Si_3N_4$ is formed on the silicide layer 115. The anti-reflecting film, the silicide layer 115, the third polysilicon layer 114 and the dielectric film 113 are then patterned by means of the etch process using the control gate mask, thus forming a control gate 116 consisting of the third polysilicon layer 114 and the silicide layer 115. Next, the first polysilicon layer 112 is patterned by means of the self-aligned etch process using the patterned anti-reflecting film, thus forming the floating gate consisting of the first polysilicon layer 112. Thereby, the flash memory cell is manufactured.

As described above, the disclosed methods of manufacturing the flash memory cell can have the following advantages.

First, only one isolation mask for defining an isolation region is used in the process of forming the isolation layer. Accordingly, the degree of difficulty in the process can be lowered and the process cost can be reduced.

Second, the top corner of the trench is formed with a small tilt angle. It is thus possible to prevent the tunnel oxide film or the gate oxide film form being too thinly formed in a subsequent process and is possible to prohibit the unwanted generation of a moat structure.

Third, the polysilicon layer for the floating gate is isolated by means of the projection of the isolation layer and the projection is then removed to increase the coupling ratio. Thus, the critical dimension can be minimized to form a uniform floating gate and variation in the coupling ratio can be prevented.

Fourth, the floating gate is uniformly formed in order to make constant the coupling ratio. It is thus possible to improve the device characteristics.

Fifth, the process condition such as the thickness of the pad nitride film, the height and width of the projection in the isolation layer and the polishing thickness of the chemical mechanical polishing process is easily controlled. Accordingly, the process margin such as controlling the surface area of the floating gate can be secured.

Sixth, the process margin can be secured and a high-integration flash memory cell of over 0.13 μm level can be also can be also easily manufactured, with the existing equipments and processes without using complex processes and expensive equipments.

The forgoing embodiments are merely exemplary and are not to be construed as limiting of this disclosure. The teachings of this disclosure can be readily applied to other types of apparatuses. Many alternatives, modifications, and variations will be apparent to those skilled in the art.

What is claimed is:

1. A method of forming an isolation layer in a semiconductor device, comprising the steps of:

sequentially forming a pad oxide film and a pad nitride film on a semiconductor substrate and then forming an aperture through which an isolation region of the semiconductor substrate is exposed;

forming a V-type trench in the isolation region having a sidewall that extends through the pad nitride and the pad oxide films and a V-shaped bottom portion in the substrate;

forming an insulating film spacer at the sidewall of the pad nitride film and pad oxide film that defines an aperture leaving the bottom portion of the V-type trench substantially exposed and intact;

forming an ion implantation layer for accelerating oxidization at the exposed bottom portion of the V-type trench;

forming a first insulating film at the exposed bottom portion V-type trench by means of an oxidization process leaving the insulation spacers substantially exposed;

filling the aperture by depositing a second insulating film on top of the first insulating film; and removing the pad nitride film and the pad oxide film.

2. The method as claimed in claim 1, wherein a tilt angle of the V type trench is 25~45°.

3. The method as claimed in claim 1, wherein the ion implantation layer is formed by implanting arsenic (As).

4. The method as claimed in claim 3, wherein arsenic (As) is implanted with energy of 15~50 keV.

5. The method as claimed in claim 3, wherein the dose of implantation of As is $1E14 \sim 1E16$ $cm^{-2}$.

6. The method as claimed in claim 1, wherein the oxidization process is performed at a temperature of 800~950° C. by setting an oxidization target thickness of 300~1000 Å, whereby the first insulating film is formed in thickness of 1500~4000 Å by means of the ion implantation layer for accelerating oxidization.

7. The method as claimed in claim 1, wherein the second insulating film is formed using a HDP oxide film and is formed in thickness of 2000~5000 Å.

* * * * *